US010658187B2

(12) United States Patent
Oppermann et al.

(10) Patent No.: US 10,658,187 B2
(45) Date of Patent: May 19, 2020

(54) METHOD FOR MANUFACTURING A SEMICONDUCTOR COMPONENT AND A SEMICONDUCTOR COMPONENT

(71) Applicant: Fraunhofer-Gesellschaft zur Foerderung der angewandten Forschung e.V., Munich (DE)

(72) Inventors: Hans-Hermann Oppermann, Berlin (DE); Kai Zoschke, Berlin (DE); Charles-Alix Manier, Berlin (DE); Martin Wilke, Berlin (DE); Tolga Tekin, Berlin (DE); Robert Gernhardt, Berlin (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 16/081,768

(22) PCT Filed: Mar. 1, 2017

(86) PCT No.: PCT/EP2017/054727
§ 371 (c)(1),
(2) Date: Aug. 31, 2018

(87) PCT Pub. No.: WO2017/148991
PCT Pub. Date: Sep. 8, 2017

(65) Prior Publication Data
US 2019/0088490 A1 Mar. 21, 2019

(30) Foreign Application Priority Data
Feb. 3, 2016 (DE) .................. 10 2016 203 453

(51) Int. Cl.
*H01L 21/00* (2006.01)
*H01L 21/304* (2006.01)
(Continued)

(52) U.S. Cl.
CPC .......... *H01L 21/304* (2013.01); *H01L 21/568* (2013.01); *H01L 21/76837* (2013.01);
(Continued)

(58) Field of Classification Search
CPC ..... H01L 2924/181; H01L 2224/45124; H01L 2224/16225; H01L 2224/97;
(Continued)

(56) References Cited

U.S. PATENT DOCUMENTS 6,423,570 B1    7/2002  Ma et al.
7,911,047 B2 *  3/2011  Hasegawa ............. H01L 23/043
                                                    257/678
(Continued)

FOREIGN PATENT DOCUMENTS

DE    102012107696 A1    2/2013
DE    102015107445 A1    11/2015
(Continued)

OTHER PUBLICATIONS

International Preliminary Report on Patentability issued in PCT/EP2017/054727 [with English machine translation], dated Sep. 4, 2018, 33 pages.
(Continued)

*Primary Examiner* — S. V. Clark
(74) *Attorney, Agent, or Firm* — Faegre Drinker Biddle & Reath LLP

(57) ABSTRACT

A method for manufacturing a semiconductor component including: providing a flat carrier with an upper side and a lower side, the carrier including a continuous opening that runs between the upper side and the lower side; providing a
(Continued)

semiconductor arrangement that includes a semiconductor chip that includes electrically and/or optically active regions on a lower side; arranging the semiconductor arrangement in the opening such that a lower side of the semiconductor arrangement and the lower side of the carrier run in a common plane; casting the semiconductor arrangement with a potting compound, such that the semiconductor arrangement is materially connected to the carrier; and thinning out the semiconductor system by way of grinding from above, such that an upper side of the carrier and an upper side of the semiconductor arrangement run in a common plane.

15 Claims, 3 Drawing Sheets

(51) Int. Cl.
| | |
|---|---|
| H01L 21/56 | (2006.01) |
| H01L 23/00 | (2006.01) |
| H01L 27/146 | (2006.01) |
| H01L 23/538 | (2006.01) |
| H01L 23/13 | (2006.01) |
| H01L 21/768 | (2006.01) |
| H01L 23/482 | (2006.01) |

(52) U.S. Cl.
CPC ............ *H01L 23/13* (2013.01); *H01L 23/538* (2013.01); *H01L 23/5383* (2013.01); *H01L 23/5389* (2013.01); *H01L 24/09* (2013.01); *H01L 24/19* (2013.01); *H01L 24/20* (2013.01); *H01L 24/96* (2013.01); *H01L 27/14643* (2013.01); *H01L 27/14689* (2013.01); *H01L 23/4827* (2013.01); *H01L 2221/6834* (2013.01); *H01L 2221/68327* (2013.01); *H01L 2221/68381* (2013.01); *H01L 2223/6627* (2013.01); *H01L 2223/6677* (2013.01); *H01L 2224/0231* (2013.01); *H01L 2224/0237* (2013.01); *H01L 2224/04105* (2013.01); *H01L 2224/06181* (2013.01); *H01L 2224/12105* (2013.01); *H01L 2224/24137* (2013.01); *H01L 2224/2518* (2013.01); *H01L 2224/32225* (2013.01); *H01L 2224/32245* (2013.01); *H01L 2224/73267* (2013.01); *H01L 2224/8384* (2013.01); *H01L 2224/83203* (2013.01); *H01L 2224/83205* (2013.01); *H01L 2224/83801* (2013.01); *H01L 2224/92244* (2013.01); *H01L 2924/1033* (2013.01); *H01L 2924/10253* (2013.01); *H01L 2924/10272* (2013.01); *H01L 2924/10329* (2013.01); *H01L 2924/1203* (2013.01); *H01L 2924/12042* (2013.01); *H01L 2924/12043* (2013.01); *H01L 2924/1304* (2013.01); *H01L 2924/1305* (2013.01); *H01L 2924/1306* (2013.01); *H01L 2924/142* (2013.01); *H01L 2924/18162* (2013.01)

(58) Field of Classification Search
CPC ..... H01L 2924/15153; H01L 21/76898; H01L 21/563; H01L 21/56
USPC ........ 438/106, 113, 125, 127; 257/750, 701, 257/787
See application file for complete search history.

(56) References Cited

U.S. PATENT DOCUMENTS

| | | | |
|---|---|---|---|
| 10,256,177 B2* | 4/2019 | Shen | H01L 23/49827 |
| 2008/0090335 A1* | 4/2008 | Morimoto | H01L 23/5389 438/118 |
| 2013/0154082 A1 | 6/2013 | Kon | |
| 2013/0249101 A1 | 9/2013 | Lin et al. | |
| 2015/0262984 A1 | 9/2015 | Krabe et al. | |
| 2016/0141281 A1* | 5/2016 | Chen | H01L 21/76877 438/107 |
| 2016/0204092 A1* | 7/2016 | Kurita | H01L 21/563 257/774 |
| 2018/0366432 A1* | 12/2018 | Paek | H01L 21/56 |

FOREIGN PATENT DOCUMENTS

| | | |
|---|---|---|
| EP | 1137066 A2 | 9/2001 |
| WO | WO02049103 A2 | 6/2002 |

OTHER PUBLICATIONS

International Search Report and Written Opinion [with English translation] issued in PCT/EP2017/054727, dated Aug. 23, 2017, 37 pages.

* cited by examiner

METHOD FOR MANUFACTURING A SEMICONDUCTOR COMPONENT AND A SEMICONDUCTOR COMPONENT

CROSS-REFERENCE TO RELATED APPLICATION

This application is a national phase application of PCT Application No. PCT/EP2017/054727, internationally filed Mar. 1, 2017, which claims priority to German Application 10 2016 203 453.7, filed Mar. 2, 2016, all of which are herein incorporated by reference in their entirety.

TECHNICAL FIELD

The application relates to a method for manufacturing a semiconductor component. The application further relates to a semiconductor component.

BACKGROUND

Regarding common methods for manufacturing electronic components, one firstly envisages manufacturing a carrier material with an opening. The carrier material is subsequently arranged with a lower side on an adhesive foil and a semiconductor chip which is separated out of a semiconductor wafer is arranged on the adhesive foil in the opening. The semiconductor wafer typically comprises electrically active regions on its lower side. The semiconductor chip is subsequently cast into a potting compound, so that the semiconductor chip is connected to the carrier material and is fixed in the opening. The adhesive film is subsequently detached and a redistribution layer is created on the lower side of the carrier and a lower side of the semiconductor chip by way of thin-film technology. The redistribution layer comprises strip conductors and creates an electrically conductive contact between the electrically active regions of the semiconductor chip and connection locations which are possibly provided on the redistribution layer for the connection of the semiconductor chip to further components. The connection locations, such as for example contact pads, solder contacts or plug contacts can hereby be distributed over a surface of the redistribution layer which is significantly larger than a surface of the semiconductor chip.

The manufacturing method which is described above is particularly suitable if the semiconductor chip comprises electrically active regions which are to be contacted only on its lower side. However, the method is unsuitable if the semiconductor chips which require an electrical contacting at their upper side or for example an optical coupling-in and coupling-out are to be used. A further problem which often occurs on using electronic components which are manufactured in such a manner is an insufficient dissipation of heat which is produced by the semiconductor chip on operation.

SUMMARY

It is an object of the present application to suggest a method for manufacturing a semiconductor component, by way of which the aforementioned disadvantages of known methods can be prevented or eliminated. Moreover, it is an object of the invention to suggest a corresponding semiconductor component.

The proposed method for manufacturing a semiconductor component comprises a provision of a flat carrier with an upper side and with a lower side, wherein the carrier comprises a continuous opening which runs between the upper side and the lower side. A semiconductor arrangement is provided in a further step. The semiconductor arrangement comprises a semiconductor chip which on a lower side comprises electrically and/or optically active regions. The semiconductor arrangement is subsequently arranged in the opening in a manner such that a lower side of the semiconductor arrangement and the lower side of the carrier run in a common plane. The semiconductor arrangement is subsequently cast with a potting compound such that the semiconductor arrangement is materially connected to the carrier. The semiconductor arrangement with the carrier and the potting compound forms a semiconductor system. The semiconductor system is subsequently thinned out by way of grinding from above, so that an upper side of the carrier and an upper side of the semiconductor arrangement run in a common plane.

The method is suitable for the manufacture of a semiconductor component which comprises the flat carrier with the upper side and the lower side, wherein the carrier comprises the continuous opening which runs between the upper side and lower side. The semiconductor component further comprises the semiconductor arrangement with the semiconductor chip which comprises the electrically and/or optically active regions on the lower side, and the potting compound, by way of which the semiconductor arrangement is materially connected to the carrier. The lower side of the semiconductor arrangement and the lower side of the carrier run in a common plane and the upper side of the carrier and the upper side of the semiconductor arrangement likewise run in a common plane. In embodiments, the lower side of the semiconductor chip forms the lower side of the semiconductor arrangement. In some embodiments, the upper side and/or the lower side of the semiconductor system are therefore planar which is to say level.

The semiconductor component can be for example an electronic component and/or an optical component. The electrically and/or optically active regions comprise for example photonically integrated circuits (PIC), integrated electronic circuits; discrete electronic semiconductor components such as for example diodes or transistors (based for example on GaN or SiC, in particular bipolar transistors with insulated gate electrodes); optoelectronic components such as laser diodes, photodiodes or image sensors; and/or photonic components (for example based on silicon).

In contrast to the initially described method, the upper side of the semiconductor arrangement is accessible on using the proposed manufacturing method. In some embodiments, one can also envisage an upper side of the semiconductor chip being accessible after the thinning-out. In this case, for example a coupling-in or coupling-out of optical signals can be effected via the upper side of the semiconductor chip, which renders possible a multitude of optoelectronic or photonic applications. In embodiments, a coupling-in and coupling-out of optical signals is effected via the lower side of the semiconductor chip. The semiconductor component can comprise for example optical waveguides, for example polymer waveguides, on the upper and lower side of the semiconductor system, for an optical coupling-out at the upper side and at the lower side respectively. Furthermore, one can also envisage the semiconductor chip likewise comprising optical waveguides which are optically coupled onto the waveguide on the upper or lower side of the semiconductor system in an evanescent or adiabatic manner.

In embodiments, a height of the semiconductor arrangement is reduced by at least 10 µm, preferably at least 50 µm, and/or at the most 500 µm, preferably at the most 200 µm, as a result of the material removable on thinning out the semiconductor system.

In embodiments, one can envisage the upper side of the semiconductor arrangement being at least regionally connected to a cooling body by way of a thermally conductive contact after the thinning-out of the semiconductor system. The cooling body can be for example a metallic or a ceramic heat spreader. The cooling body can be thermally conductively connected to the upper side of the semiconductor arrangement as well as to the upper side of the carrier in a simple manner by way of the semiconductor system being thinned out such that an upper side of the carrier and an upper side of the semiconductor arrangement run in a common plane. A particularly efficient thermal dissipation from the semiconductor chip via the upper side of the semiconductor arrangement and the upper side of the carrier can be achieved by way of this.

After thinning out the semiconductor system, one can also envisage the upper side of the semiconductor arrangement being at least regionally connected to an electrically conductive contact which at least regionally is electrically conductively connected to an upper side of the semiconductor chip. The suggested method is therefore particularly suitable for semiconductor components with semiconductor chips, in particular vertically constructed semiconductor chips which require a rear-side contacting at their upper side. Hereby, these can be for example diodes or field-effect transistors with substrate contactings. Hereby, known methods for manufacturing the electrically conductive contact and which are particularly suitable for planar geometries, such as for example thin-film technology for creating a solderable or sinterable rear-side contact or a redistribution layer, can be used due to the fact that the semiconductor system is thinned out such that an upper side of the carrier and an upper side of the semiconductor arrangement run in a common plane.

What is meant by the fact that the upper sides of the semiconductor arrangement and of the carrier run in a common plane is that a plane which runs through most points on the upper side of the semiconductor arrangement is essentially not tilted with respect to a plane which runs through most points on the upper side of the carrier and moreover has no offset with respect to this plane. In a maximally tilted direction, the respective planes, in some embodiments enclose an angle of 5 degrees at the most, preferably 2 degrees at the most. An offset of the planes in the region of the semiconductor arrangement is 10 µm at the most, preferably 5 µm at the most, particularly preferably 2 µm at the most. This analogously applies to the lower sides of the semiconductor arrangement and of the carrier.

In embodiments, the upper sides and the lower sides of the carrier and of the semiconductor arrangement are not completely planar. However, in some embodiments, a common plane exists, to which at least 90%, preferably at least 95% of points which are located on the upper side of the carrier and on the upper side of the semiconductor arrangement have a distance of 5 µm at the most, preferably 2 µm at the most, particularly preferably 1 µm at the most, measured perpendicularly to the common plane. This analogously applies to the lower sides of the semiconductor arrangement and of the carrier.

In embodiments, a gap is formed between the semiconductor arrangement and the carrier. As a rule, the opening in the carrier is designed such that an as small as possible gap with a maximal gap width of 200 µm at the most, preferably 100 µm at the most results. The gap is filled at least regionally with potting compound after the casting of the semiconductor arrangement. After thinning out the semiconductor system, the potting compound, in some embodiments, likewise comprises an upper side which runs in a common plane with the upper sides of the carrier and of the semiconductor arrangement. The potting compound can comprise for example polyimide and/or artificial resin and/or benzocyclobutene.

One can envisage the thinning-out of the semiconductor system being effected by way of removing material from the semiconductor arrangement. For example, one can hereby envisage grinding into the semiconductor arrangement from above, in particular without grinding into the carrier. In some embodiments, one can envisage material only being removed from the semiconductor arrangement on grinding. If one grinds into the semiconductor arrangement, then the semiconductor arrangement subsequently has a grinded upper side. However, the semiconductor system can also be thinned out by way of material abrasion or material removal from the carrier and from the semiconductor arrangement. If one grinds into the carrier, then the carrier subsequently comprises a grinded upper side. In other embodiments, one grinds from above into the carrier as well as into the semiconductor arrangement. A planar upper side of the semiconductor system can be manufactured by way of a common grinding of the semiconductor arrangement and of the carrier. For example, one can envisage the upper side of the semiconductor arrangement being formed by a substrate of the semiconductor chip and the semiconductor chip being thinned out by way of material removal from the substrate. Embodiments are suitable in order to ensure in a simple manner that the upper side of the carrier and the upper side of the semiconductor arrangement run in a common plane, particularly if the semiconductor chip has no sensitive electrically and/or optically active regions on its upper side, concerning which regions any possible destruction due to the grinding is undesirable.

In other embodiments, one can envisage the semiconductor arrangement comprising a sacrificial layer on an upper side, said sacrificial layer being thinned out on grinding. The grinded upper side of the semiconductor arrangement is formed by the grinded sacrificial layer on account of this. The thinning-out of the semiconductor arrangement can be carried out without having to grind into the semiconductor chip due to the use of the sacrificial layer. The use of a sacrificial layer is particularly suitable when the upper side of the semiconductor chip is electrically active and/or the semiconductor chip comprises a rear side contact at its upper side. Furthermore, concerning semiconductor chips which comprise materials which are of a burden to the environment, such as for example GaAs, on grinding, one can prevent environmentally unfriendly waste or toxic grinding dust from being produced, said waste or dust in particular representing a potential risk to the health of persons.

The sacrificial layer can comprise a metallic, ceramic or semi-conductive material. In particular, materials with a high thermal conductivity are suitable for the sacrificial layer, since the sacrificial layer in this case can ensure an efficient heat dissipation from the semiconductor chip. Furthermore, an electrical conductivity of the sacrificial layer can be desirable in certain embodiments, for example so that the sacrificial layer can be used for the electrical contacting of the semiconductor chip. Metallic sacrificial layers in particular are characterised by a high thermal conductively and a likewise high electrical conductivity.

The sacrificial layer can be deposited for example on the upper side of the semiconductor chip. Hereby, common methods such as electrodeposition (galvanic deposition), vapour-deposition or a sputtering method can be applied. Hereby, the vapour deposition and the sputter method are, in some embodiments, suitable for small thicknesses of the sacrificial layer of about 1 μm and less. Electrodeposition is suitable in the case of greater thicknesses. As a rule, a good heat transfer between the semiconductor chip and the sacrificial layer can be achieved due to a deposition of the sacrificial layer.

However, one can also envisage the sacrificial layer being fastened on an upper side of the semiconductor chip. Various known chip-bonding methods such as for example soldering, transient liquid phase bonding, thermocompression bonding, ultrasound welding, sintering or bonding can be applied for fastening the sacrificial layer on the upper side of the semiconductor chip. Compared to the deposition of the sacrificial layer, fastening is particularly suitable if relatively thick sacrificial layers are to be provided in a simple manner.

Upper sides of the semiconductor which are very smooth compared to alternative solutions can be produced by way of grinding into the sacrificial layer or into the semiconductor chip. For producing a planar upper side of a semiconductor system, instead of grinding, an alternative solution could envisage bringing a sacrificial layer onto the semiconductor chip, wherein this sacrificial layer on account of its thickness creates a flush termination of the semiconductor arrangement with the upper side of the carrier. In this case, the upper side of the semiconductor system would however be less planar than in the case of a use of the suggested manufacturing method, for example due to the oblique cuts of the semiconductor wafer.

In some embodiments, an auxiliary carrier, on which the carrier is arranged, can be provided before the casting. The semiconductor arrangement can be arranged on the auxiliary carrier in the opening of the carrier. Hereby, for example it can be the semiconductor arrangement which is arranged on the auxiliary carrier first of all, or the carrier. The carrier is characterised by an essentially planar upper side. Thus one can succeed in the lower side of the semiconductor arrangement and the lower side of the carrier running in a common plane in a simple manner. The auxiliary carrier can be designed for example as a glass carrier. One can also envisage for example the auxiliary carrier on an upper side comprising an adhesive foil or an adhesive film, on which the semiconductor arrangement and the carrier are arranged before the casting and by way of which the semiconductor arrangement and the carrier are fixed before the casting.

One can also envisage at least one further semiconductor arrangement being provided, said further semiconductor arrangement being arranged in the opening and being cast (moulded) into the potting compound. The further semiconductor arrangement can comprise all features which are described with regard to the semiconductor arrangement. Hereby, the semiconductor arrangement and the further semiconductor arrangement can comprise for example identical or different heights and/or identical or different materials.

In some embodiments, the provision of the carrier comprises the step of incorporating the opening into the carrier. The incorporation of the opening can be effected for example by way of dry-etching or laser cutting.

In some embodiments, the carrier comprises a metallic or semi-conductive material, in particular silicon. In particular, one can envisage the carrier comprising the same material as the semiconductor chip and/or the possibly provided sacrificial layer. Equal or at least similar coefficients of thermal expansion of the carrier and of the semiconductor chip and/or of the sacrificial layer which result due to this can minimise mechanical stresses within the semiconductor component as a result of heating or cooling, as well as damage to the semiconductor components which this possibly entails. In other embodiments, the carrier can comprise for example ceramic or glass.

In a further step, a redistribution layer can be manufactured on a lower side of the semiconductor system, wherein the redistribution layer comprises strip conductors which are electrically conductively connected at least regionally to the electrically and/or optically active regions of the semiconductor chip.

Generally, the measures for the electrical and/or thermal contacting which have been described here with regard to the upper side or lower side of the semiconductor system can also be carried out in an analogous manner on the lower side or upper side of the semiconductor system.

BRIEF DESCRIPTION OF THE DRAWINGS

Embodiment examples are hereinafter described by way of figures. There are shown in.

DETAILED DESCRIPTION

Figure 1:
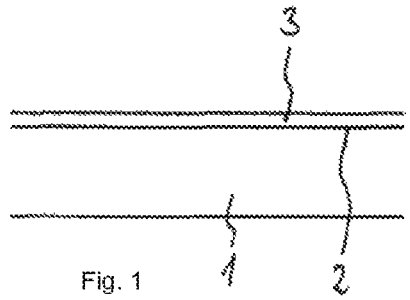
FIGS. 1-6 schematic cross sections during successive method steps on manufacturing a semiconductor component, according to embodiments of the disclosure, FIG. 7 a view upon a semiconductor system which is represented in FIG. 6, according to embodiments of the disclosure, FIGS. 8 and 9 schematic views during further method steps on manufacturing a semiconductor component, according to embodiments of the disclosure, and FIGS. 10-13 schematic views of semiconductor components, according to embodiments of the disclosure.

A method for manufacturing a semiconductor component is illustrated in FIGS. 1 to 6. As is shown in FIG. 1, concerning this method, an auxiliary carrier 1 whose upper side 2 is provided with an adhesive film 3 is firstly provided. The adhesive film 2 can be spun for example onto the upper side 2 of the auxiliary carrier 1. The auxiliary carrier 1 can be designed for example as a glass carrier. In a further method step, a flat carrier 4, for example a silicon wafer is arranged on the adhesive film 3.

Figure 2:
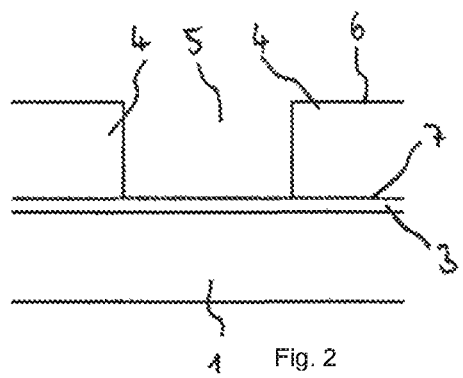

As is represented in FIG. 2, the carrier 4 comprises an opening 5 which runs between an upper side 6 of the carrier 4 and a lower side 7 of the carrier 4. Recurring features are provided with the same reference numerals in these and the following figures. The opening 5 can be previously incorporated into the carrier 4 by way of common methods, for example by way of dry-etching or laser cutting. A semiconductor arrangement 8 is subsequently provided.

Figure 3:
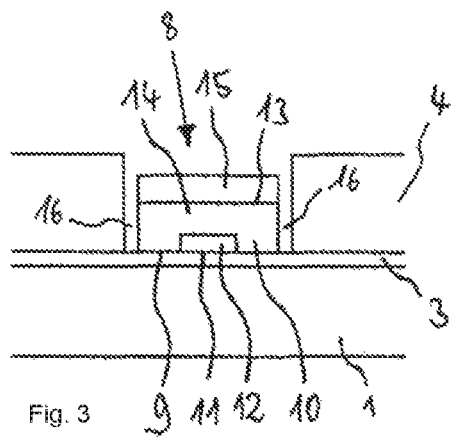

As is represented in FIG. 3, the semiconductor arrangement 8 is arranged on the adhesive film 3 and in the opening 5 of the carrier 4, so that the semiconductor arrangement 8 is laterally surrounded by the carrier 4. Hereby, one can envisage the semiconductor arrangement 8 having a smaller height than the carrier 4, so that the carrier 4 projects beyond the semiconductor arrangement 8 after arranging the semiconductor arrangement 8 in the opening 5, as is represented in FIG. 3. However, in other embodiments, one can envisage the semiconductor arrangement 8 projecting beyond the carrier 4 after the arranging.

The semiconductor arrangement 8 at its lower side 9 comprises a semiconductor chip 10 which on its lower side 11 comprises electrically and/or optically active regions 12, hereinafter called active regions. At its upper side 13, the semiconductor chip 10 can comprise for example a chip substrate 14 which can be designed in an electrically conductive or insulating or semi-insulating manner. The semiconductor chip 20 can comprise for example integrated circuits and/or photonically integrated circuits. For example, metallisations for the electrical contacting of the integrated circuits and/or of the photonically integrated circuits can be provided in the active regions 12 of the semiconductor chip 10.

The semiconductor arrangement 8 additionally comprises a sacrificial layer 15 which has been bonded onto the upper side 13 of the semiconductor chip 10, for example by way of ultrasound welding. In other embodiments, one can envisage the sacrificial layer 15 being for example galvanically deposited on the semiconductor chip 10. The sacrificial layer 15 has a high thermal conductivity. Furthermore, a boundary surface between the sacrificial layer 15 and the upper side 13 of the semiconductor chip 10 has a high thermal conductively. The sacrificial layer 15 can comprise for example a metal or can be formed completely from a metal. A gap 16 is arranged between the semiconductor arrangement 8 and the carrier 4.

Figure 4:
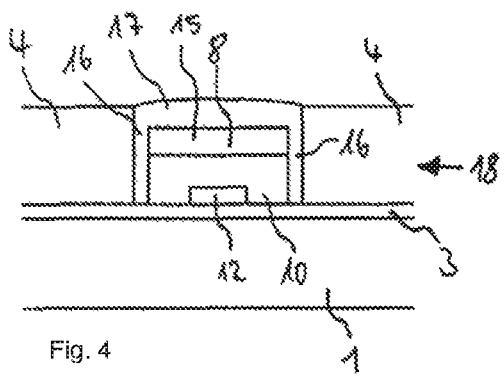

In a further step, the semiconductor arrangement 8 is cast with a potting compound 17, for example with artificial resin, as is represented in FIG. 4. On casting, the gap 16 is filled out with the potting compound 17. The potting or casting compound 17 moreover covers the semiconductor arrangement 8 after the casting. In embodiments, after the casting, the potting compound 17 also covers the upper side 6 of the carrier 4 additionally to the semiconductor arrangement 8. The casting can be effected for example at an increased temperature or an increased pressure. A material connection between the potting compound 17 and the semiconductor arrangement 8 as well as between the potting compound 17 and the carrier 4 is produced by way of the casting. The carrier 4, the potting compound 17 and the semiconductor arrangement 8 form a semiconductor system 18 after the casting.

Figure 5:
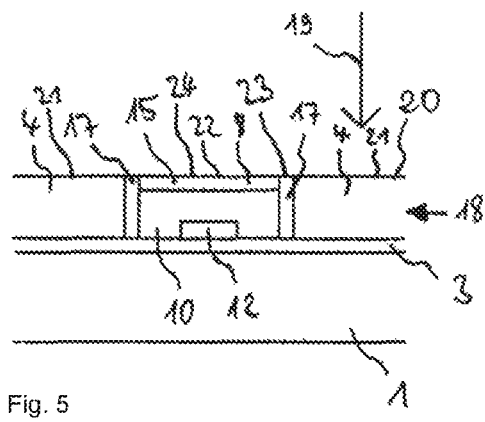

In a further step, the semiconductor system 18 is removed from above in a direction 19 which is schematically represented in FIG. 5. In the represented example, hereby material is firstly removed from the carrier 4 as well as from the potting compound 17. Given a greater grinding depth, material is additionally removed from the semiconductor arrangement 8, so that the sacrificial layer 15 is thinned out as is represented in FIG. 5. If the semiconductor arrangement 8 has a greater height that the carrier 4, as is envisaged in other embodiments, then on grinding, material is removed from the semiconductor arrangement 8 before material is removed from the carrier 4. However, in some embodiments one can also envisage no material being removed from the carrier 4 on grinding. In particular, one can envisage material only being removed from the semiconductor arrangement 8 on grinding. Hereby, as a rule, material is removed from the sacrificial layer 15.

After the grinding, the semiconductor system 18 has a plane or smooth upper side 20. The upper side 20 of the semiconductor system 18 is regionally formed by a grinded upper side 21 of the carrier 4, a grinded upper side 22 of the semiconductor arrangement 8 as well as by a grinded upper side 23 of the potting compound 17. The upper side 22 of the semiconductor arrangement 8 is formed by a grinded upper side 24 of the sacrificial layer 15. The mentioned grinded upper sides 21, 22, 23, 24 run in a common plane.

Figure 6:
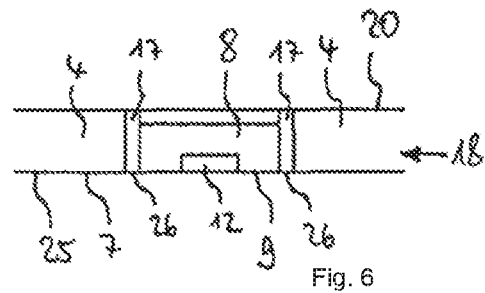

In a next step, the auxiliary carrier 1 and the adhesive film 3 are detached from the semiconductor system 18 as is shown in FIG. 6, which can be carried out for example by way of laser ablation, by way of the adhesive film 3 being radiated or beamed with a laser through the auxiliary carrier 1. A lower side 25 of the semiconductor system 18 is regionally formed by the lower side 7 of the carrier 4, by the lower side 9 of the semiconductor arrangement 9 as well as by a lower side 26 of the potting compound 17. The mentioned lower sides 7, 9, 26 run in a common plane due to the fact that the carrier 4 and the semiconductor arrangement 8 are arranged on the adhesive film 3 and have been cast on this with the potting compound 17.

Figure 7:
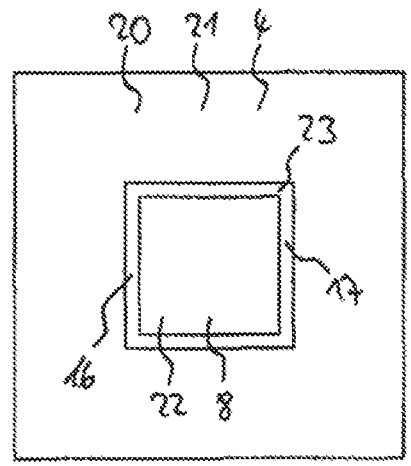

FIG. 7 shows a plan view upon the upper side 20 of the semiconductor system 18. The upper side 21 of the carrier 4 surrounds the upper side 22 of the semiconductor arrangement 8. The gap 16 which is filled out by the potting compound 17 is formed between the upper side 21 of the carrier 4 and the upper side 22 of the semiconductor arrangement 8.

Figure 8:
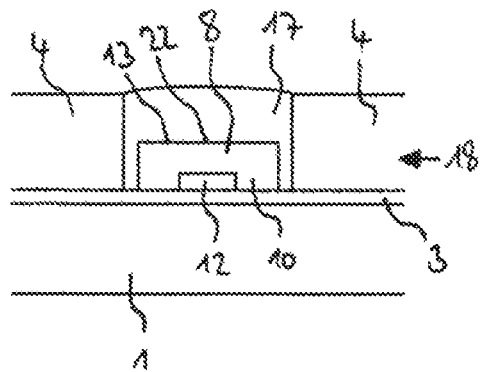
Figure 9:
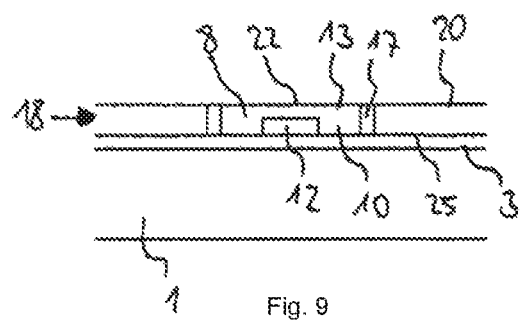

A modification of the method is represented in FIGS. 8 and 9. This modified method differs from the method which has been described above in that the semiconductor arrangement 8 comprises no sacrificial layer 15. Before grinding the semiconductor system 18, with which the carrier 4, the potting compound 17 and the semiconductor chip 10 are thinned out from above, the upper side 13 of the semiconductor chip 10 forms the upper side 22 of the semiconductor arrangement 8, as is represented in FIG. 8. FIG. 9 shows the semiconductor system 18 after the grinding. Hereby, the now grinded upper side 13 of the semiconductor chip 10 continues to form the upper side 22 of the grinded semiconductor arrangement 8 and simultaneously a region of the upper side 20 of the semiconductor system 18.

In further steps, thermal or electrical contacts can be produced on the upper side 20 and/or on the lower side 25 of the semiconductor system 18, for manufacturing a completed semiconductor component.

Figure 10:
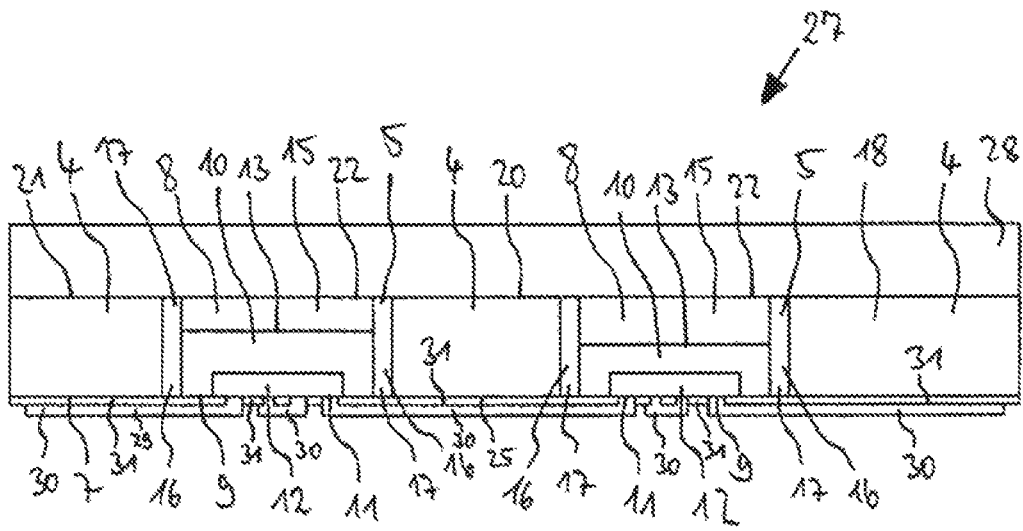

A semiconductor component 27 which is manufactured according to the described method is shown in FIG. 10. This component comprises a carrier 4 with two openings 5, in each of which a semiconductor arrangement 8 is arranged. The carrier 4 is designed as a silicon frame in the present example. The two semiconductor arrangements 8 each comprise a semiconductor chip 10, for example a gallium nitride chip, and a sacrificial layer 15, wherein the sacrificial layers 15 are arranged on an upper side 13 of a respective one of the semiconductor chips 10 and are connected to this chip in a thermally conductive manner. The sacrificial layers 15 can be designed for example as metal bases which are each bonded onto one of the semiconductor chips 10. The semiconductor chips 10 at their lower sides 11 each comprise active regions 12.

The semiconductor arrangements 8 are cast into a potting compound 17 which fills out the gap 16 between the carrier 4 and the semiconductor arrangements 8 and materially connects the carrier 4 to the semiconductor arrangements 8. The lower sides 9 and the upper sides 22 of the semiconductor arrangements 8 run in a common plane with the lower sides 7 and upper sides 21 of the carrier 4.

The semiconductor arrangements 8, the potting compound 17 and the carrier 4 form a semiconductor system 18 which comprises an upper side 20 and a lower side 25. A cooling body 28, for example a heat spreader of an aluminium nitride ceramic is arranged on the upper side 20 of the semiconductor system 18, for the dissipation of operating heat which is produced by the semiconductor arrangements 8. The cooling body 28 can furthermore be connected to an air cooler, a water cooler or a metal housing in a thermally conductive manner. The cooling body 28 is connected to the upper sides 22 of the semiconductor arrangements 8 and to the upper side 21 of the carrier 4 by way of a thermally conductive contact. A high proximity between the flat cooling body 28 and the upper sides 22, 21 of the semiconductor arrangements 8 and of the carrier 4 and therefore an efficient heat transfer between the semiconductor system 18 and the cooling body 28 can be achieved by way of the planar upper side 20 of the semiconductor system 18. The thermally conductive contact can be additionally improved via a thermal interface material, for example a thermally conductive paste.

A redistribution layer 29 is arranged on the lower side 25 of the semiconductor system 18. The redistribution layer 29 serves for a spatial redistribution of electrical contactings to the semiconductor chip 10 and for this comprises electrically conductive strip conductors 30 and electrically insulating regions 31. The strip conductors 30 connect the electrically active regions 12 amongst one another and/or to further connection locations such as contact pads or solder balls, which are possibly provided on the redistribution layer 29.

Figure 11:
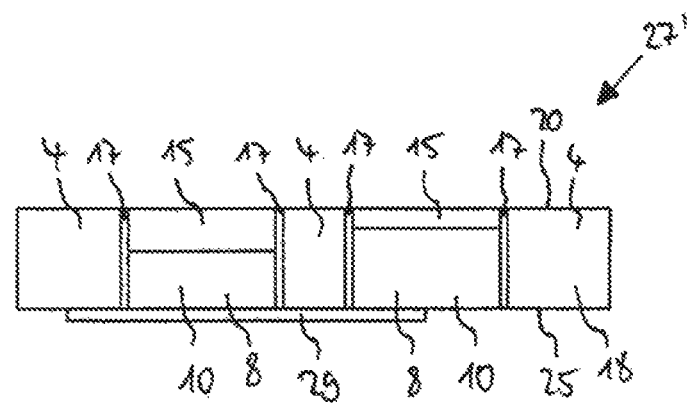

Further embodiment examples of a semiconductor component 27' are represented in FIG. 11. In embodiments, the lower side 25 of the semiconductor system 18 is provided with a redistribution layer 29 which is provided with strip conductors in the form of a structured metallisation. The active regions of the semiconductor chips 10 which are not represented are contacted by the redistribution layer 29. The represented component 27' can be for example a high-frequency module. The semiconductor component 27' can additionally comprise further components such as for example amplifiers for the operation of a transmitting antenna. The further components can be designed for example as part of the redistribution layer 29 or be embedded into the carrier 4. In some embodiments, the redistribution layer 29 is manufactured by way of thin-film technology and can comprise for example impedance-controlled strip conductors, micro-strip conductors or coplanar conductors. The upper side 20 of the semiconductor system 18 is suitable in the previously described example for a connection to a cooling body.

Figure 12:
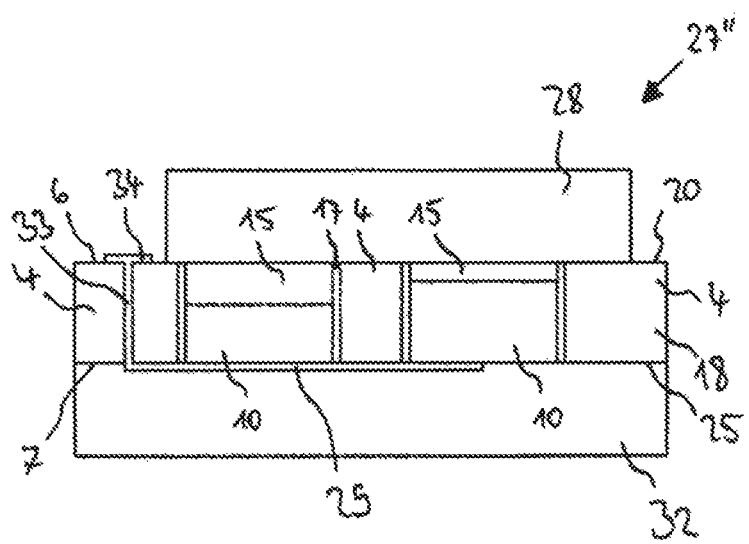

FIG. 12 shows embodiments of a semiconductor component 27". In contrast to the semiconductor component 27' which is represented in FIG. 11, this semiconductor component 27" comprises a cooling body 28 which is connected to the upper side 20 of the semiconductor system 18 in a thermally conductive manner. Furthermore, a second cooling body 21 is arranged on the lower side 25 of the semiconductor system 18 and on a lower side of the redistribution layer 29, so that an efficient heat dissipation can be effected from the semiconductor system 18 via its upper side 20 and via its lower side 25. Embodiment examples are therefore particularly suitable for components of the power electronics, for example for switching and converting high voltages or currents. The semiconductor chips 10 can be based for example on silicon, silicon carbide or gallium nitride and, in some embodiments, comprise one or more transistors and/or diodes. The carrier 4 furthermore comprises an electrically conductive through-contact 33 which runs between the upper side 6 of the carrier 4 and the lower side 7 of the carrier 4. Strip conductors of the redistribution layer 29 are electrically conductively connected to the through-contact 33. Furthermore, a contact pad 34 which is electrically conductively connected to the through-contact 33 is provided on the upper side 6 of the carrier 4.

Figure 13:
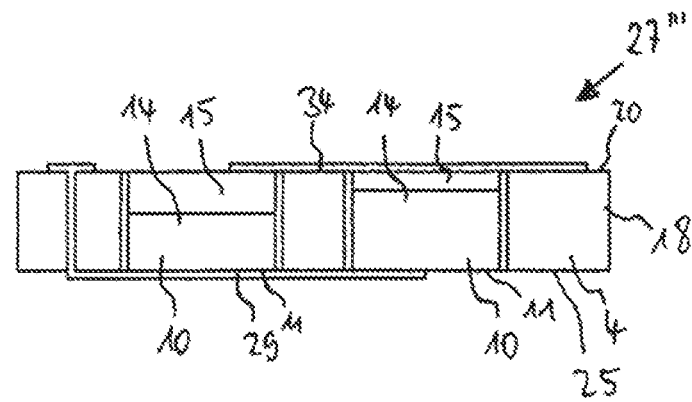

Further embodiment examples of a semiconductor component 27''' are represented in FIG. 13. This semiconductor component 27''' differs from the previously described semiconductor components 27, 27', 27" by way of the fact that apart from the redistribution layer 29, it comprises a second redistribution layer 34 which is arranged on the upper side 20 of the semiconductor system 18 and whose strip conductors are connected to the sacrificial layers 15 in an electrically conductive manner. The semiconductor chips 10 each comprise a chip substrate 14 which is designed in an electrically conductive manner. The sacrificial layers 15 are likewise designed in an electrically conductive manner and are electrically conductively connected to the chip substrates 14. An electrical contacting of the semiconductor chip 10 on both sides is achieved by way of this. The represented embodiments are therefore suitable for semiconductor components whose operation amongst other things requires a substrate-side electrical contacting of a semiconductor chip. Hereby, in embodiments, an electrical contact is created to each of the chip substrates 14 and several electrical contacts to the active regions on each of the lower sides 11 of the semiconductor chip 10, whereby the active regions are not represented. The lower sides 11 of the semiconductor chip 10 are largely freely accessible despite a regional contacting by the redistribution layer 29 from a lower side of the semiconductor component 27'''. For this reason, this lower side of the semiconductor component 27''' is particularly suitable for example for coupling electromagnetic radiation out of the semiconductor chips 10 or coupling it into the semiconductor chips 10. The semiconductor chips 10 can be designed for example as light diodes, as surface-emitting laser diodes or as photodetectors. The semiconductor component 27''' can additionally comprise for example optical waveguides on the lower side 25 of the semiconductor system 18.

In the described and further embodiments, the sacrificial layers can be deposited on the semiconductor chips or can be fastened to the semiconductor chips. The sacrificial layers are, in some embodiments, manufactured of metal, ceramic or semi-conductive material. In embodiments, a semiconductor arrangement can comprise for example several semiconductor chips and one sacrificial layer or conversely several sacrificial layers and one semiconductor chip. Hereby, the several semiconductor chips or sacrificial layers are arranged on the same side of the sacrificial layer and of the semiconductor chip respectively.

In the described and further embodiment examples, the upper side of the semiconductor system can also be polished with a fine-grained abrasive agent after the grinding and before the creation of an electrical or thermal contact, in order to produce a particularly smooth upper side of the semiconductor system. Subsequently or alternatively, in a further step, one can envisage the upper side of the semiconductor system being prepared for an electrical or thermal coupling by way of creating solderable regions on the upper side, for example by way of a deposition of Cu, Ni/Au, Ti/Pt/Au.

The features of the various embodiments which are only disclosed in the embodiment examples can be combined with one another and claimed individually.

The invention claimed is:

1. A method for manufacturing a semiconductor component, the method comprising:
   providing a flat carrier with an upper side and a lower side, wherein the carrier comprises an opening that runs between the upper side and the lower side;
   providing a semiconductor arrangement that comprises a semiconductor chip, wherein the semiconductor chip comprises electrically and/or optically active regions on a lower side and the semiconductor arrangement comprises a sacrificial layer on an upper side, the sacrificial layer comprising metallic or semi-conductive material;

arranging the semiconductor arrangement in the opening such that a lower side of the semiconductor arrangement and the lower side of the carrier run in a common plane;

casting the semiconductor arrangement with a potting compound, such that the semiconductor arrangement is materially connected to the carrier, wherein the semiconductor arrangement with the carrier and with the potting compound forms a semiconductor system; and thinning out the semiconductor system by way of grinding from above, the sacrificial layer being thinned out on grinding, such that an upper side of the carrier and an upper side of the semiconductor arrangement run in a common plane.

2. A method according to claim 1, characterized in that the thinning out of the semiconductor system is effected by way of removing material from the semiconductor arrangement.

3. A method according to claim 1, characterized in that the thinning out of the semiconductor system is effected by way of material removal from the carrier and from the semiconductor arrangement.

4. A method according to claim 1, characterized in that the provision of the semiconductor arrangement comprises:
depositing the sacrificial layer on an upper side of the semiconductor chip.

5. A method according to claim 1, characterized in that the provision of the semiconductor arrangement comprises:
fastening the sacrificial layer to an upper side of the semiconductor chip.

6. A method according to claim 1, characterized in that an auxiliary carrier is provided before the casting, on which auxiliary carrier the carrier is arranged, wherein the semiconductor arrangement is arranged on the auxiliary carrier on arranging the semiconductor arrangement in the opening of the carrier.

7. A method according to claim 1, characterized in that at least one further semiconductor arrangement is provided, the further semiconductor arrangement being arranged in the opening and being cast into the potting compound.

8. A method according to claim 1, characterized in that the carrier comprises a metallic or semi-conductive material.

9. A method according to claim 1, characterized in that after the thinning out of the semiconductor system, the upper side of the semiconductor arrangement is connected at least regionally to a cooling body by way of a thermally conductive contact.

10. A method according to claim 1, characterized in that after the thinning out of the semiconductor system, the upper side of the semiconductor arrangement is connected at least regionally to an electrically conductive contact which is at least regionally electrically conductively connected to an upper side of the semiconductor chip.

11. A method according to claim 1, characterized by:
manufacturing a redistribution layer on a lower side of the semiconductor system, wherein the redistribution layer comprises strip conductors which are at least regionally electrically conductively connected to the electrically and/or optically active regions of the semiconductor chip.

12. A semiconductor component manufactured by a method according to claim 1.

13. A semiconductor component comprising a flat carrier with an upper side and a lower side, wherein the carrier comprises an opening that runs between the upper side and the lower side, a semiconductor arrangement that comprises a semiconductor chip, wherein the semiconductor chip comprises electrically and/or optically active regions on a lower side and the semiconductor arrangement comprises a sacrificial layer on an upper side, the sacrificial layer comprising metallic or semi-conductive material and the sacrificial layer being thinned out by grinding, and a potting compound, by way of which the semiconductor arrangement is materially connected to the carrier, wherein the lower side of the semiconductor arrangement and the lower side of the carrier run in a common plane, characterized in that the upper side of the carrier and an upper side of the semiconductor arrangement run in a common plane.

14. A semiconductor component according to claim 13, characterized in at least 90% of points which arc located on the upper side of the carrier and on the upper side of the semiconductor arrangement have a distance to the common plane of 5 μm at most, measured perpendicularly to the common plane.

15. A semiconductor component according to claim 13, characterized in that the semiconductor arrangement comprises a grinded upper side.

* * * * *